(12) United States Patent
Deng

(10) Patent No.: US 7,061,820 B2
(45) Date of Patent: Jun. 13, 2006

(54) VOLTAGE KEEPING SCHEME FOR LOW-LEAKAGE MEMORY DEVICES

(75) Inventor: Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/649,266

(22) Filed: Aug. 27, 2003

(65) Prior Publication Data

US 2005/0047233 A1 Mar. 3, 2005

(51) Int. Cl.
*G11C 5/14* (2006.01)
(52) U.S. Cl. .................. 365/227; 365/189.09; 365/226
(58) Field of Classification Search ........... 365/189.06, 365/189.09, 226, 227
See application file for complete search history.

(56) References Cited

U.S. PATENT DOCUMENTS

| | | | | |
|---|---|---|---|---|
| 5,615,162 A | * | 3/1997 | Houston | 365/226 |
| 5,715,191 A | * | 2/1998 | Yamauchi et al. | 365/156 |
| 5,726,562 A | * | 3/1998 | Mizuno | 323/312 |
| 5,734,604 A | * | 3/1998 | Akamatsu et al. | 365/156 |
| 5,969,995 A | * | 10/1999 | Morishima | 365/189.01 |
| 5,999,459 A | | 12/1999 | Liu | |
| 6,181,611 B1 | | 1/2001 | Liu | |
| 6,657,911 B1 | * | 12/2003 | Yamaoka et al. | 365/226 |
| 6,731,564 B1 | * | 5/2004 | Tran et al. | 365/229 |

* cited by examiner

*Primary Examiner*—Son Mai
(74) *Attorney, Agent, or Firm*—Jacqueline J. Garner; Wade James Brady, III; Frederick J. Telecky, Jr.

(57) ABSTRACT

The present invention facilitates memory device operation by mitigating power consumption during suspend modes of operation, also referred to as sleep/data retention modes. This is accomplished by employing one or more gate-sinking voltage keeper components that operate as leakage current sinks during the suspend mode of operation instead of gate-sourcing voltage keeper components that operate as leakage current sources during the suspend mode of operation, on a circuit node whose voltage level is maintained by a sinking voltage regulator. As a result, less leakage current is required to be dissipated/sunk by a voltage regulator and/or other circuit paths or components of the memory device. Thus, relatively less power is consumed.

25 Claims, 10 Drawing Sheets

VOLTAGE KEEPING SCHEME FOR LOW-LEAKAGE MEMORY DEVICES

FIELD OF THE INVENTION

The present invention relates generally to the field of semiconductor devices, and more particularly, to a low voltage maintenance scheme for low-leakage memory devices.

BACKGROUND OF THE INVENTION

Portable electronic devices, including cellular phones, personal digital assistants, digital audio players, digital cameras, and the like, increasingly demand higher performance, smaller sizes, and lower power/energy consumption. As a result, circuit components and devices that comprise these portable electronic devices also need higher performance, smaller sizes, and lower power/energy consumption.

One component typically associated with portable electronic devices is a static random access memory (SRAM), which is a memory device that can store or maintain information with little or no power. This type of memory contrasts with dynamic random access memory (DRAM), commonly used in desktop computer systems, that loses stored information without frequent refresh cycles.

Wireless devices can be especially prone to low energy consumption concerns. Many next generation wireless systems employ combined RF-analog-digital systems on a single chip in order to reduce power consumption. Wireless devices, as well as other electronic devices, usually include a suspend/standby mode in which a device is not completely turned off, but is in a "sleep/data retention state" or a low power consumption data retention state. It is important that the memory devices maintain the integrity of stored information during these standby modes.

One problem encountered in SRAM devices is that of leakage during low power or standby/suspend modes. SRAM devices can employ one or more transistors as "voltage keepers" that hold selected control and data access lines (e.g., word line, bit line, and the like) as well as array VSS (VSSA) lines to desired voltage levels during suspend mode, in order to reduce array leakage. However, these voltage keeper transistors themselves can add leakage during suspend mode due to direct gate tunneling leakage of the transistors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates memory device operation by mitigating power consumption during suspend modes, also referred to as sleep/data retention modes. This is accomplished by employing one or more gate-sinking voltage keeper components that operate as leakage current sinks during suspend mode instead of gate-sourcing voltage keeper components that operate as leakage current sources, on a circuit node whose voltage level is maintained by a sinking voltage regulator. As a result, less current is required to be dissipated/sunk by a voltage regulator and/or other circuit paths or components of the memory device. Thus, relatively less power is consumed.

A gate-sinking component is referred to herein as a component whose gate tunneling leakage is of a sinking type (i.e., flowing out of the control gate terminal) during the suspend mode. A gate-sourcing component, on the other hand, is referred to herein as a component whose gate tunneling leakage is of a sourcing type (i.e., flowing into the control gate terminal) during the suspend mode. A sinking voltage regulator is referred to herein as a voltage regulator whose output voltage is clamped to a reference voltage level by sinking away the current (the net of all other current) flowing into the output node. A sourcing voltage regulator, on the other hand, is referred to herein as a voltage regulator whose output voltage is clamped to a reference voltage level by sourcing with the current (the net of all other current) flowing out of the output node. A sinking voltage is referred to herein as a voltage generated by a sinking voltage regulator. A sourcing voltage, on the other hand, is referred to herein as a voltage generated by a sourcing voltage regulator.

PMOS based gate-sinking voltage keeper components are employed in place of NMOS based gate-sourcing voltage keeper components on a circuit node whose voltage level is maintained by a sinking voltage regulator. NMOS based gate-sourcing voltage keeper components tend to generate/source leakage current during the suspend mode as a result of gate tunneling leakage current. PMOS based gate-sinking voltage keeper components, on the other hand, operate as leakage current sinks during the suspend mode and thus sink just a portion of leakage current generated by an associated memory array, and hence do not add leakage.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
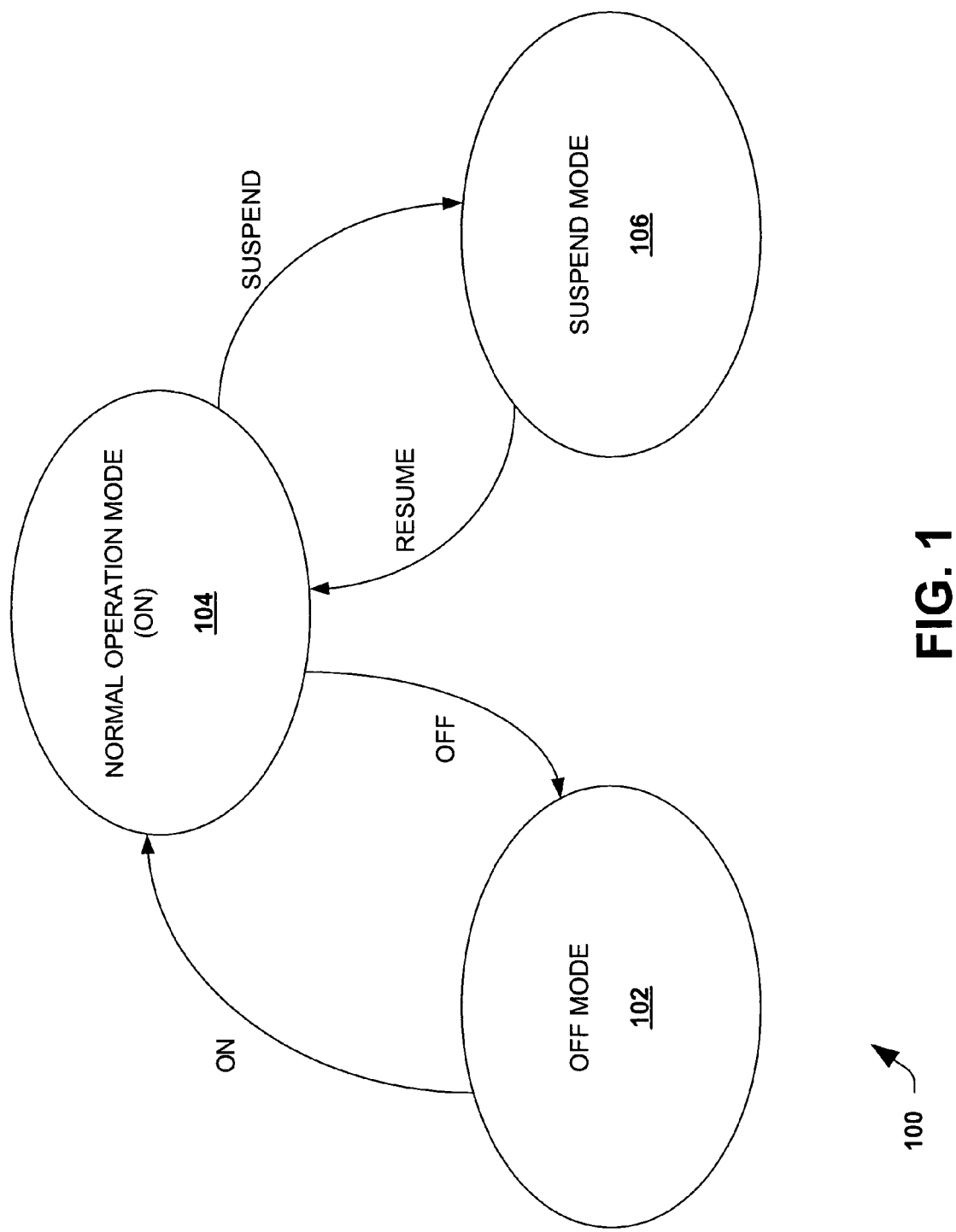
FIG. 1 is a state diagram illustrating operational modes for a memory device in accordance with an aspect of the present invention.

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention provides systems and methods that can reduce power consumption for memory devices when operating in a suspend or sleep/data retention mode. Power reduction is accomplished by employing one or more gate-sinking components that operate as leakage current sinks instead of gate-sourcing components that operate as leakage current sources during the suspend mode, on a circuit node whose voltage level is maintained by a sinking voltage regulator. Additional power reduction may be accomplished by employing one or more gate-sourcing components that operate as leakage current sources instead of gate-sinking components that operate as leakage current sinks during the suspend mode, on a circuit node whose voltage level is maintained by a sourcing voltage regulator. As a result, a total amount of current generated by a memory device in suspend mode can be reduced and, therefore, power consumption of the memory device can be reduced.

A gate-sinking component is referred to herein as a component whose gate tunneling leakage is of a sinking type (i.e., flowing out of the control gate terminal) during the suspend mode. A gate-sourcing component, on the other hand, is referred to herein as a component whose gate tunneling leakage is of a sourcing type (i.e., flowing into the control gate terminal) during the suspend mode. A sinking voltage regulator is referred to herein as a voltage regulator whose output voltage is clamped to a reference voltage level by sinking away the current (the net of all other current) flowing into the output node. A sourcing voltage regulator, on the other hand, is referred to herein as a voltage regulator whose output voltage is clamped to a reference voltage level by sourcing with the current (the net of all other current) flowing out of the output node. A sinking voltage is referred to herein as a voltage generated by a sinking voltage regulator. A sourcing voltage, on the other hand, is referred to herein as a voltage generated by a sourcing voltage regulator.

Generally, a memory array is supplied with a retention voltage, which is smaller than the normal operation voltage, across the array in order to maintain data during the suspend mode. As a result, an amount of leakage current is generated by the memory array. The retention voltage is typically achieved by raising an array VSS (VSSA) input to a sinking suspend voltage level and optionally lowering an array VDD (VDDA) input to a sourcing suspend voltage level. To further reduce the array leakage, either or both of the word line (WL) and the bit line (BL) can be biased at the sinking suspend voltage as well during suspend mode. NMOS based gate-sourcing voltage keeper components operate as leakage current sources during the suspend mode and thus add to the leakage current generated by the memory array. Instead, the present invention employs PMOS based gate-sinking voltage keeper components that operate as leakage current sinks during the suspend mode and thus reduce the amount of leakage current present.

Beginning with FIG. 1, a state diagram 100 depicting various operational modes for a memory device in accordance with an aspect of the present invention is shown. The diagram 100 illustrates three basic states of operation, an off mode 102, a normal operation mode 104, and a suspend mode 106.

The off mode 102 of operation is simply a state in which no power is supplied to the memory device nor consumed by the memory device. If the memory device is non-volatile, the device can maintain stored data for a period of time without power. Otherwise, such as in the case of a static random access memory (SRAM), all stored data is erased. The normal mode 104 of operation is a state in which data is written to and read from the device. In this state, the device is fully powered and active.

The suspend mode 106 of operation is a reduced power or low power consumption state in which the memory device is neither operational nor off. In the suspend mode 106, a reduced amount of power is supplied to the memory device. However, the device can change from suspend mode 106 to normal operation mode 104 substantially quicker than can the device change from off mode 102 to the normal operation mode 104. While in the suspend mode 106, the device is operable to maintain its data without loss. Additionally, the power consumption of the device in the suspend mode 106, although not zero, is substantially less than that of the normal operation mode 104.

Figure 2:
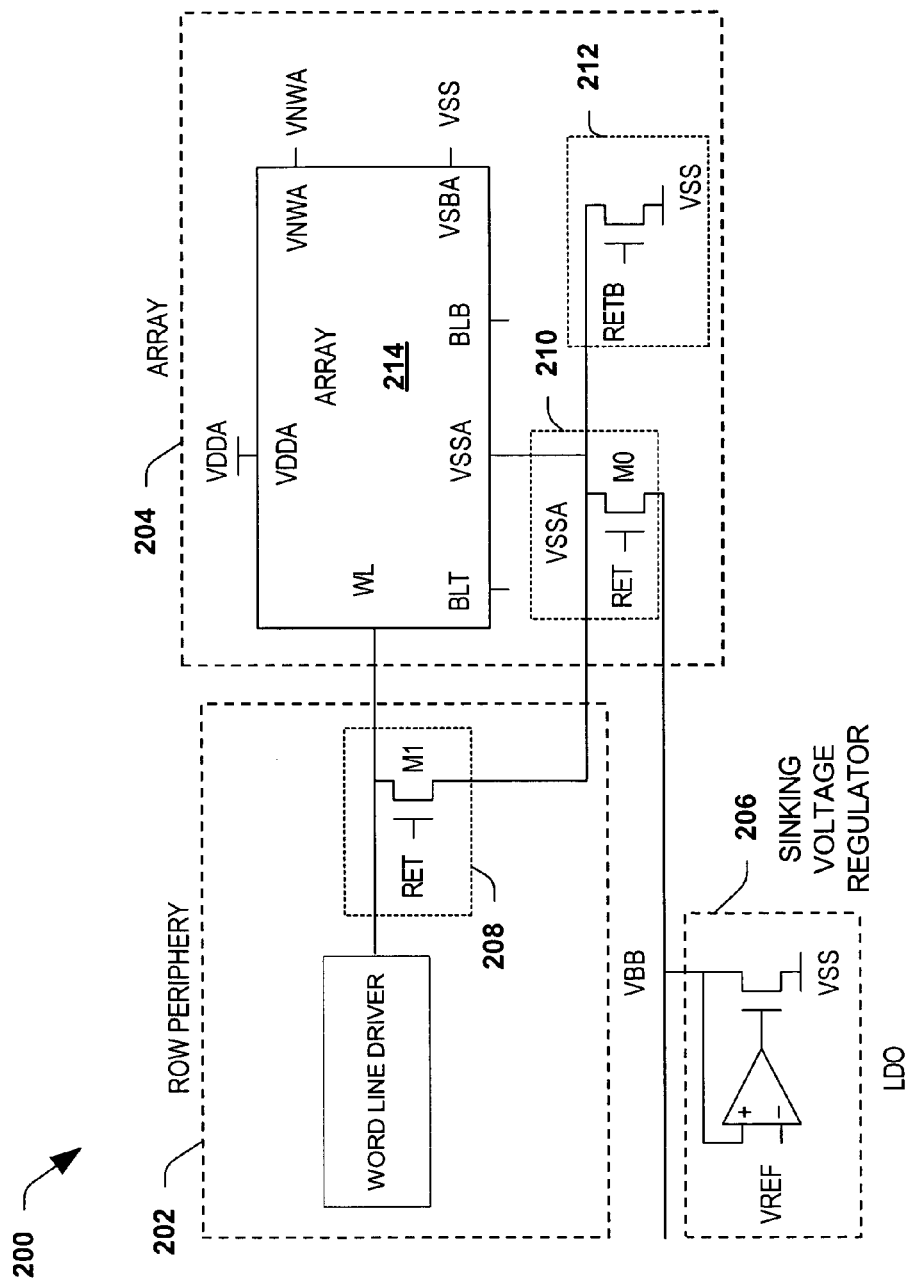
FIG. 2 is a schematic diagram illustrating a portion of a memory device.

FIG. 2 is a schematic illustrating a portion of a memory device 200 operable in a suspend mode. The device 200 is described generally and particularly with regard to suspend mode operation. The memory device 200 includes row periphery circuitry 202, an array component 204, and a sinking voltage regulator 206.

The row periphery circuitry 202 facilitates selecting various lines of the array component 204, for example, selectively activating word lines. The circuitry 202 includes a first gate-sourcing voltage keeper component 208, comprised of an NMOS transistor, that controllably supplies a sinking suspend voltage during a suspend mode/state of operation. During other modes or states, the first gate-sourcing voltage keeper component 208 isolates the circuitry 202 from the sinking suspend voltage. The first gate-sourcing voltage keeper component 208 is controlled by a signal RET that is generally asserted (high) during a suspend mode and de-asserted (e.g., goes low) otherwise. It is noted that this description generally assumes that an asserted signal activates a device while a de-asserted signal turns such a device off. However, the present invention contemplates variations in which the opposite condition holds, and such variations are contemplated by the present invention.

The array component 204 comprises a second gate-sourcing voltage keeper component 210, a footer switch 212, and a memory array 214. The memory array 214 includes inputs for a word line voltage (WL), an array VSS input (VSSA), and an array VDD input (VDDA). The VSSA is biased to a VSS supply voltage and the VDDA is biased to a VDD supply voltage during normal mode operation. During suspend mode, the VSSA is biased to a sinking supply voltage and optionally the VDDA is biased to a sourcing supply voltage. The second gate-sourcing voltage keeper component 210, like the first gate-sourcing voltage keeper component 208, controllably supplies the sinking suspend voltage during suspend mode/state of operation to the memory array 214 and also comprises an NMOS transistor. During other modes or states of operation, the second gate-sourcing voltage keeper component 210 at least partially isolates the memory array 214 from the sinking suspend voltage. Typically, the second gate-sourcing voltage keeper component 210 supplies the sinking suspend voltage to the VSSA of the memory array 214 whereas the first gate-sourcing voltage keeper component 208 supplies the sinking suspend voltage to the WL's (word lines) of the memory array 214. The second gate-sourcing voltage keeper component 210 is also controlled by the signal RET that is generally asserted during a suspend mode and de-asserted otherwise.

The footer switch 212 controllably supplies the VSS supply voltage to the VSSA input of the memory array 214. The footer switch 212 comprises an NMOS transistor and is controlled by a signal RETB, which is the complement of the signal RET, such that the signal RETB is de-asserted during the suspend mode and asserted otherwise.

The sinking voltage regulator 206 generates and supplies the sinking source voltage at least during the suspend mode of operation. The sinking suspend voltage is supplied to the first gate-sourcing voltage keeper component 208 and the second gate-sourcing voltage keeper component 210 such that the memory array 214 can receive the sinking suspend voltage during the suspend mode of operation. Additionally, the sinking voltage regulator 206 can operate to sink leakage current generated by the memory array 214.

In a typical application, the suspend mode requires that the voltage applied to the VDDA input be kept at normal voltage level (e.g., 1.3V) while the voltage applied to the array nwell input (VNWA) be raised to a higher voltage (e.g., 1.8V). The RET signal raises from about 0V to a normal voltage level (e.g., 1.3V) and the RETB signal drops from a normal voltage level to about 0V. The VSSA input and word line are raised to the sinking suspend voltage generated by the sinking voltage regulator 206 (e.g., about 0.8V). A bit line (BL) typically floats to a voltage level close to the sinking suspend voltage.

During the suspend mode, the memory array 214 generates an amount of leakage current (i.e., operates as a leakage current source, referencing to the sinking voltage node). The first gate-sourcing voltage keeper component 208 and the second gate-sourcing voltage keeper component 210 also generate leakage current during the suspend mode operation by way of sourcing gate leakage into the NMOS transistors. The total leakage current generated by the leakage current sources during the suspend mode of operation is dissipated by one or more leakage current sinks present in the device (e.g., the sinking voltage regulator). This dissipated leakage current translates into undesirable power consumption that can result in shortening battery life, loss of data, excess thermal energy, and the like.

Figure 3:
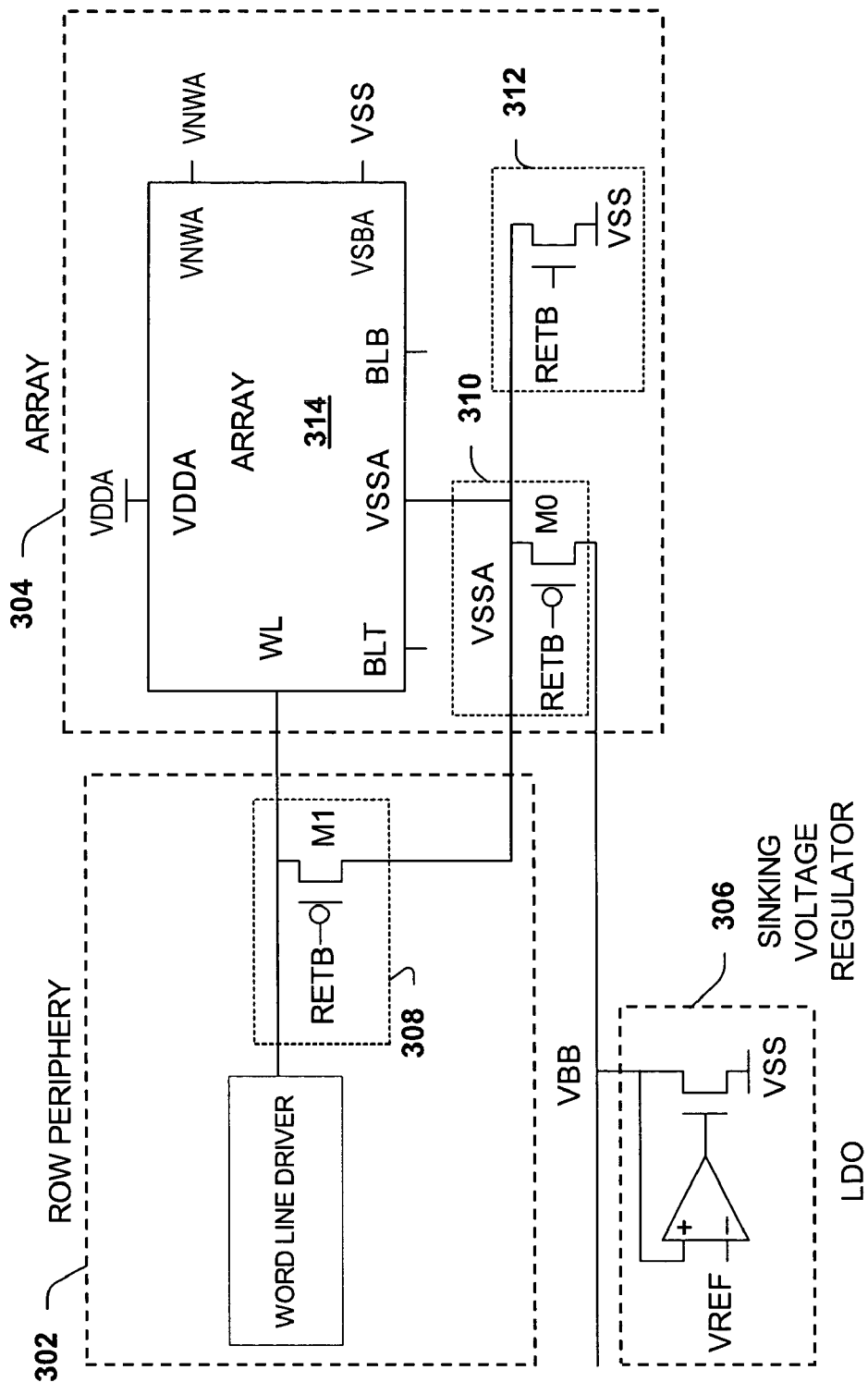
FIG. 3 is a schematic diagram illustrating a portion of a memory device in accordance with an aspect of the present invention.

FIG. 3 is a schematic diagram illustrating a memory device portion 300 in accordance with an aspect of the present invention. The device 300 is described generally and particularly with regard to the suspend mode of operation. The device 300 consumes relatively less power than the similar memory device 200 of FIG. 2 because the memory device 300 employs gate-sinking voltage keeper components that operate as leakage current sinks instead of gate-sourcing voltage keeper components that act as leakage current sources during the suspend mode of operation. The memory device 300 includes row periphery circuitry 302, an array component 304, and a voltage regulator 306.

The row periphery circuitry 302, as with the circuitry 202 of FIG. 2, facilitates selecting various control lines of the array component 304. The circuitry 302 includes a first gate-sinking voltage keeper component 308, comprised of a PMOS transistor instead of an NMOS transistor that controllably supplies a sinking suspend voltage during the suspend mode of operation. During other modes or states, the first gate-sinking voltage keeper component 308 isolates the circuitry 302 from the suspend voltage. The first gate-sinking voltage keeper component 308 is controlled by a signal RETB that is generally asserted (low signal) during a suspend mode of operation and de-asserted otherwise (high signal), which is opposite the control of the first gate-sourcing voltage keeper component 208 of FIG. 2.

The array component 304 comprises a second gate-sinking voltage keeper component 310, a footer switch 312, and a memory array 314. The memory array 314 includes inputs for a word line voltage (WL), an array VSS voltage (VSSA), and an array VDD voltage (VDDA). Additionally, the second gate-sinking voltage keeper component 310 controllably supplies the sinking suspend voltage during the suspend mode of operation to the memory array 314 and comprises a PMOS transistor. During other modes or states of operation, the second gate-sinking voltage keeper component 310 at least partially isolates the memory array 314 from the sinking suspend voltage. Typically, the second gate-sinking voltage keeper component 310 supplies the sinking suspend voltage to the VSSA input of the memory array 314 whereas the first gate-sinking voltage keeper component 308 supplies the suspend voltage to the WL's (word lines) of the memory array 314. The second gate-sinking voltage keeper component 310 is also controlled by the signal RETB that is generally asserted during a suspend mode of operation and de-asserted otherwise.

The footer switch 312 controllably supplies a VSS voltage to the memory array 314, particularly to the VSSA input of the memory array 314 at least during normal mode. The footer switch 312 comprises an NMOS transistor and is controlled by the signal RETB and is de-asserted (low) during the suspend mode of operation and asserted otherwise. It is noted that the signal RET, which is the complement of RETB, can be present and employed elsewhere in the device 300.

The sinking voltage regulator 306 generates and supplies the sinking suspend voltage at least during the suspend mode of operation. The sinking suspend voltage is supplied to the first gate-sinking voltage keeper component 308 and the second gate-sinking voltage keeper component 310 such that the memory array 314 can receive the sinking suspend voltage during the suspend mode of operation. Additionally, the sinking voltage regulator 306 can operate to sink leakage current generated by the memory array 314. Furthermore, the sinking voltage regulator 306 can be a low-dropout voltage regulator (LDO).

In a typical application, the suspend mode of operation requires that the voltage applied to the VDDA input be kept at a normal voltage level (e.g., about 1.0 to 1.3V) while the array nwell supply input (VNWA) be raised to a higher voltage level (e.g., 1.8V). The RET signal raises from about 0V to a normal voltage level (e.g., about 1.0 to 1.3V) and the RETB signal drops from a normal voltage level to about 0V. The VSSA input and word line rise to the sinking suspend voltage generated by the sinking voltage regulator 306 (e.g., about 0.3 to 0.8V or 0.7 to 0.4 V below the normal mode voltage). A bit line (BL) typically floats to a voltage level close to the suspend voltage. One or more additional gate-sinking voltage keeper components can also be employed that controllably connect bit lines of the memory array 314 to the sinking suspend voltage regulator 306.

The memory array 314 generates an amount of leakage current (i.e., operates as a leakage current source) during the suspend mode of operation, which is generally due to data retention purposes. The first gate-sinking voltage keeper component 308 and the second gate-sinking voltage keeper component 310, in contrast with the similar gate-sourcing voltage keeper components of FIG. 2, operate as leakage current sinks instead of sources during the suspend mode of operation by way of sinking gate leakage from the PMOS transistors. Thus, the total leakage current generated is reduced. As a result, the amount of leakage current dissipated can be substantially reduced when compared with the device 200 of FIG. 2. Similarly, undesirable power consumption, relative to that by device 200 of FIG. 2, can be reduced.

Figure 4:
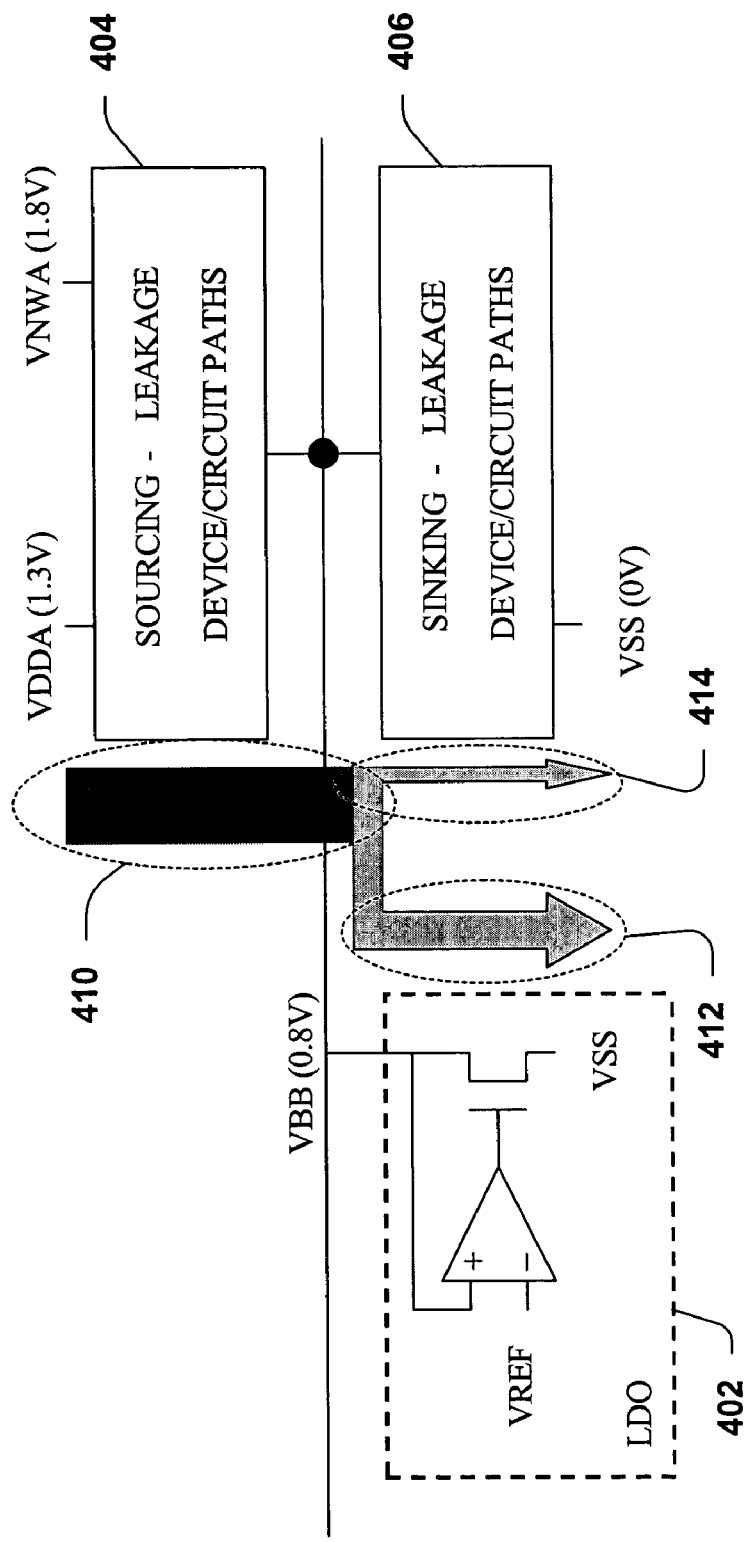
FIG. 4 is a block diagram illustrating current leakage distribution for an exemplary memory device portion.

FIG. 4 is a block diagram illustrating current leakage for a memory device 400 during a suspend mode of operation. The diagram illustrates sourcing and sinking of leakage current through the memory device 400 and its circuit paths, wherein the memory device 400 employs gate-sinking voltage keeper components that operate as leakage current sources during the suspend mode of operation. As a result, additional and undesirable power is consumed from these voltage keeper components.

The memory device 400 is comprised of a sinking voltage regulator 402, sourcing leakage device/circuit paths 404, and sinking leakage device/circuit paths 406. The voltage regulator 402 operates at least during the suspend mode of operation to generate a sinking suspend voltage for raising an array VSS (VSSA) input of a memory array to the sinking suspend voltage. It is appreciated that the sinking voltage regulator 402 can supply the sinking suspend voltage to more than one memory array and still be in accordance with the present invention.

Sourcing leakage current 410 is generated by the sourcing leakage device/circuit paths 404 during the suspend mode of operation. Generally, the leakage current is substantially generated by the memory array, across which is supplied with a retention voltage in order to maintain data during the suspend mode of operation, and one or more gate-sourcing voltage keeper components. However, because NMOS type gate-sourcing voltage keeper components contribute source leakage current, the total source leakage 410 is larger than merely the array leakage contribution. Sinking leakage current 414 is generated by the sinking leakage device/circuit paths 406 during the suspend mode of operation. Generally, the sinking leakage current 414 is substantially less than the sourcing leakage current 410. It is appreciated that the amount of source leakage current and sink leakage current are substantially equal in order to properly balance and control leakage current. Thus, the sinking voltage regulator 402 sinks extra sourcing leakage current 412 not sunk by the sinking leakage device/circuit paths 406 and clamps the sinking suspend voltage to a desired level (e.g., 0.8 V).

Figure 5:
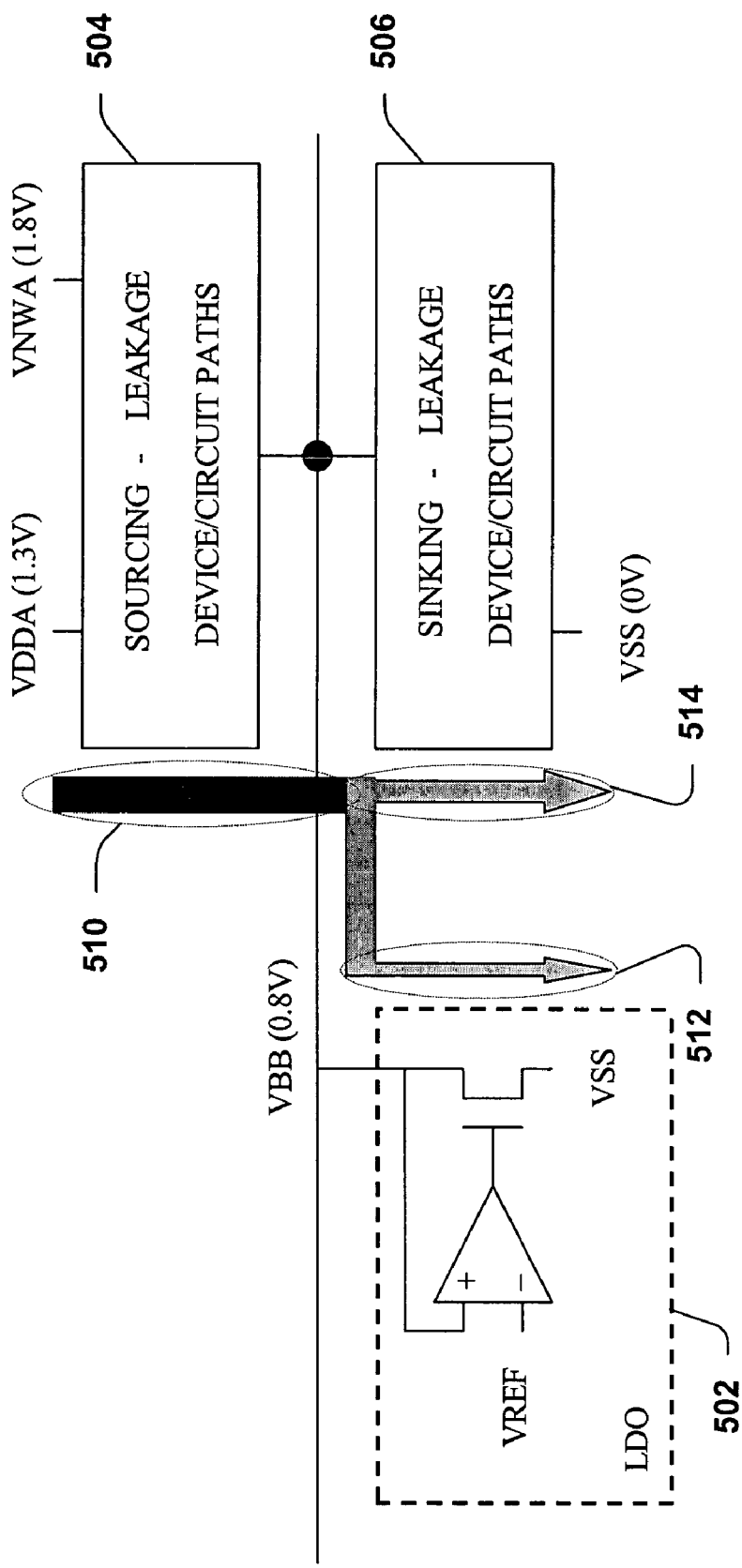
FIG. 5 is a block diagram illustrating current leakage distribution for an exemplary memory device portion in accordance with an aspect of the present invention.

Turning now to FIG. 5, another block diagram illustrating leakage current for a memory device 500 during the suspend mode of operation in accordance with an aspect of the present invention is shown. The diagram illustrates sourcing and sinking of leakage current through the memory device 500 and its circuit paths, wherein the memory device 500 employs gate-sinking voltage keeper components that operate as leakage current sinks instead of gate-sourcing voltage keeper components that operate as leakage current sources during the suspend mode of operation. As a result, less power is consumed by the device 500 than the device 400 of FIG. 4.

The memory device 500 operates in a similar manner to that of the memory device 400 of FIG. 4, except that the memory device 500 employs gate-sinking voltage keeper components that operate as leakage current sinks instead of gate-sourcing voltage keeper components that operate as leakage current sources during the suspend mode of operation. For brevity, some discussion of the memory device 500 is omitted.

The memory device 500 is comprised of a sinking voltage regulator 502, sourcing leakage device/circuit paths 504, and sinking leakage device/circuit paths 506. Sourcing leakage current 510 is generated by the sourcing leakage device/circuit paths 504 during the suspend mode of operation. Generally, the leakage current 510 is substantially generated by the memory array, across which is supplied with a retention voltage in order to maintain data during the suspend mode of operation. This sourcing leakage current 510 is relatively less than the leakage current 410 generated in FIG. 4 because the gate-sinking voltage keeper components operate as sinks instead of sources, and thus do not contribute to the source leakage 510 in FIG. 5.

Sinking leakage current 514 is generated by the sinking leakage device/circuit paths 506 during the suspend mode of operation, which includes the gate-sinking voltage keeper components. Generally, the sinking leakage current 514 is less than the sourcing leakage current 510. Again, it is appreciated that the amount of source leakage current and sink leakage current are substantially equal in order to properly balance and control leakage current. Thus, the sinking voltage regulator 502 sinks extra sourcing current 512 not sunk by the sinking leakage device/circuit paths 506 and clamps the reference voltage to a desired level (e.g., 0.8 V). The amount of extra sourcing leakage current 512 sunk by the voltage regulator 502 is substantially less than that of the extra sourcing leakage current 412 of FIG. 4 because the sinking voltage keepers divert leakage that would otherwise go to the regulator and because the total mount of source leakage current is reduced. Accordingly, the memory device 500 consumes relatively less power than the memory device 400 of FIG. 4.

Figure 6:
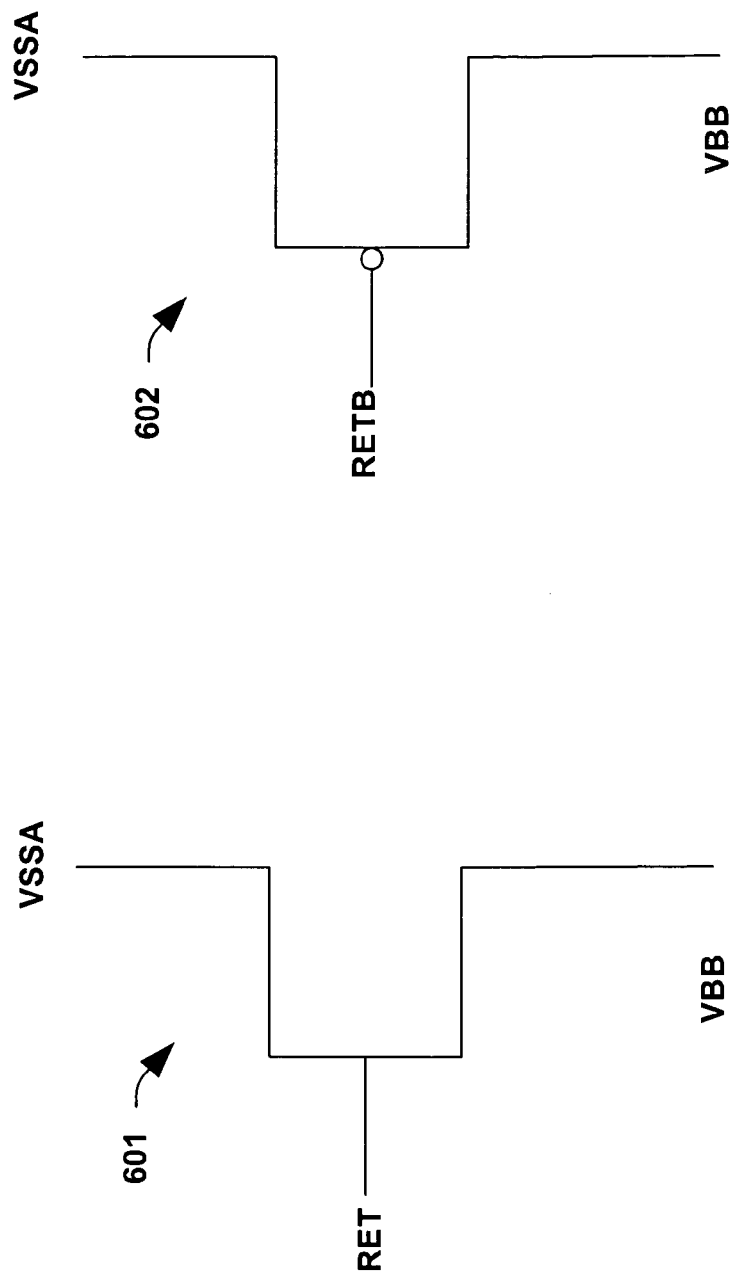
FIG. 6 is a diagram illustrating a detailed view of exemplary components in accordance with an aspect of the present invention.

FIG. 6 is a diagram illustrating a detailed view of an exemplary gate-sourcing voltage keeper component 601 and an exemplary gate-sinking voltage keeper component 602 in accordance with an aspect of the present invention. For this view, the gate-sourcing voltage keeper component 601 is part of a first memory device and the gate-sinking voltage keeper component 602 is part of a second memory device. The first and second memory devices are similar in operation but for their respective voltage keeper components. The gate-sourcing voltage keeper component 601 is comprised of an NMOS transistor whereas the gate-sinking voltage keeper component 602 is comprised of a PMOS transistor.

Beginning with the gate-sourcing voltage keeper component 601, a RET signal, referred to as a retention signal, is supplied/connected to a gate of the NMOS transistor. A drain of the NMOS transistor is electrically connected to an array VSS (VSSA) and a source is biased to a sinking suspend or reference voltage supplied by a voltage regulator (not shown). During normal mode or normal operation, the RET signal is de-asserted and remains low (e.g., about 0V). The VSSA voltage is biased to a normal mode supply voltage (e.g., about 0V) and is isolated from the voltage regulator and the suspend voltage.

Figure 7:
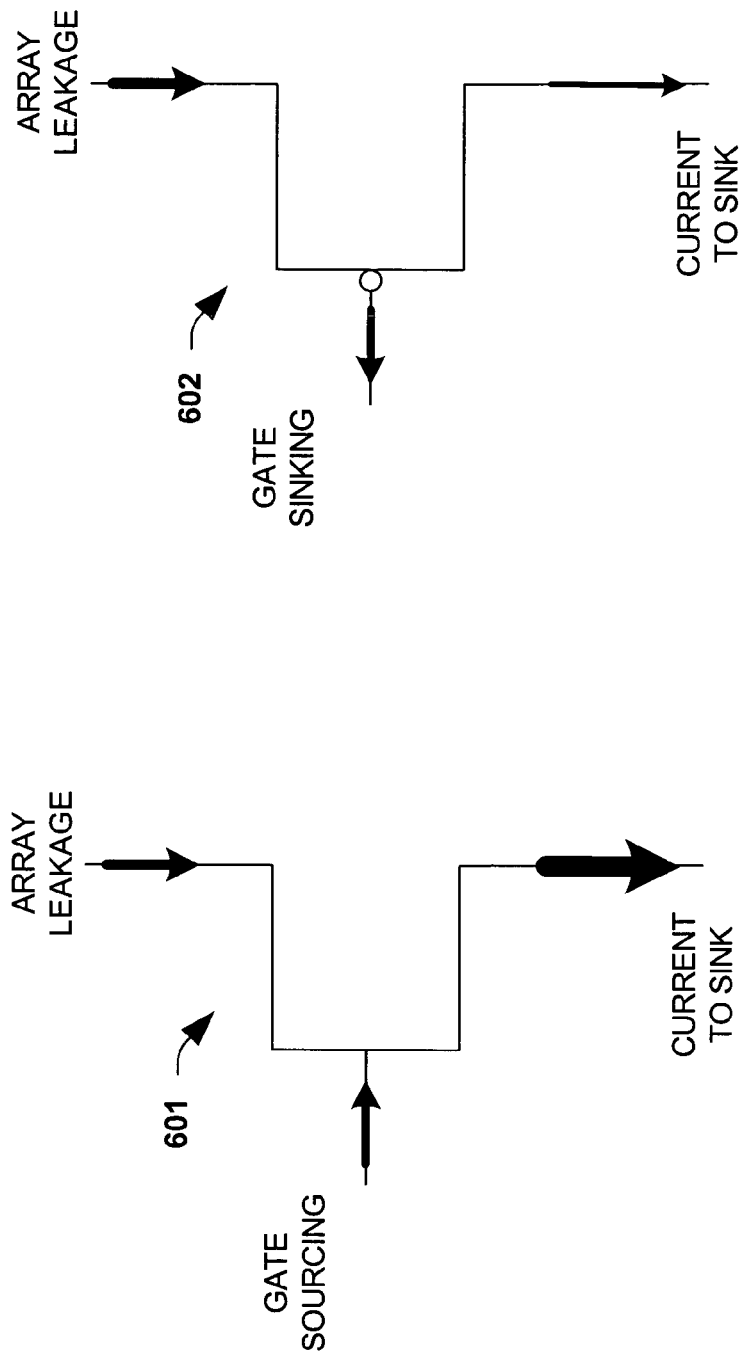
FIG. 7 is a diagram further illustrating a detailed view of exemplary memory components in accordance with an aspect of the present invention.

During the suspend mode of operation, the RET signal is asserted and remains high (e.g., about 1.3V). The array VSS voltage (VSSA) is biased to the suspend voltage through the gate-sourcing voltage keeper component 601 and is isolated from the normal supply voltage. However, gate tunneling occurs, thereby generating gate sourcing leakage current as shown in FIG. 7 because of several factors such as the suspend voltage, temperature, and the like. This gate sourcing circuit combined with array leakage current resulting in a substantial amount of source leakage current. This source leakage current can cause excessive thermal energy to be generated and raises the suspend voltage above a desired value. Additionally, this source leakage current results in excessive power consumption.

Turning now to the gate-sinking voltage keeper component 602, a RETB signal, referred to as a complement of the retention signal, is supplied/connected to a gate of the PMOS transistor. A source of the PMOS transistor is electrically connected to an array VSS (VSSA) input and a drain is biased to a sinking suspend voltage supplied by a voltage regulator (not shown). During normal mode or normal operation, the RETB signal is de-asserted and remains high (e.g., about 1.3 V). The VSSA input is biased to a normal mode supply voltage (e.g., about 0 V) and is isolated from the voltage regulator and the sinking suspend voltage.

During the suspend mode of operation, the RETB signal is asserted and remains low (e.g., about 0 V). The VSSA input is biased to the sinking suspend voltage through the gate-sinking voltage keeper component 602 and is isolated from the normal supply voltage. However, gate tunneling occurs generating gate sinking leakage current as shown in FIG. 7. This gate sinking reduces the amount of source leakage current that would otherwise need to be sunk. Further, since the PMOS device does not contribute to source leakage, the total amount of source leakage is effectively reduced. This reduced amount of source leakage current can result in substantial power savings.

Figure 8:
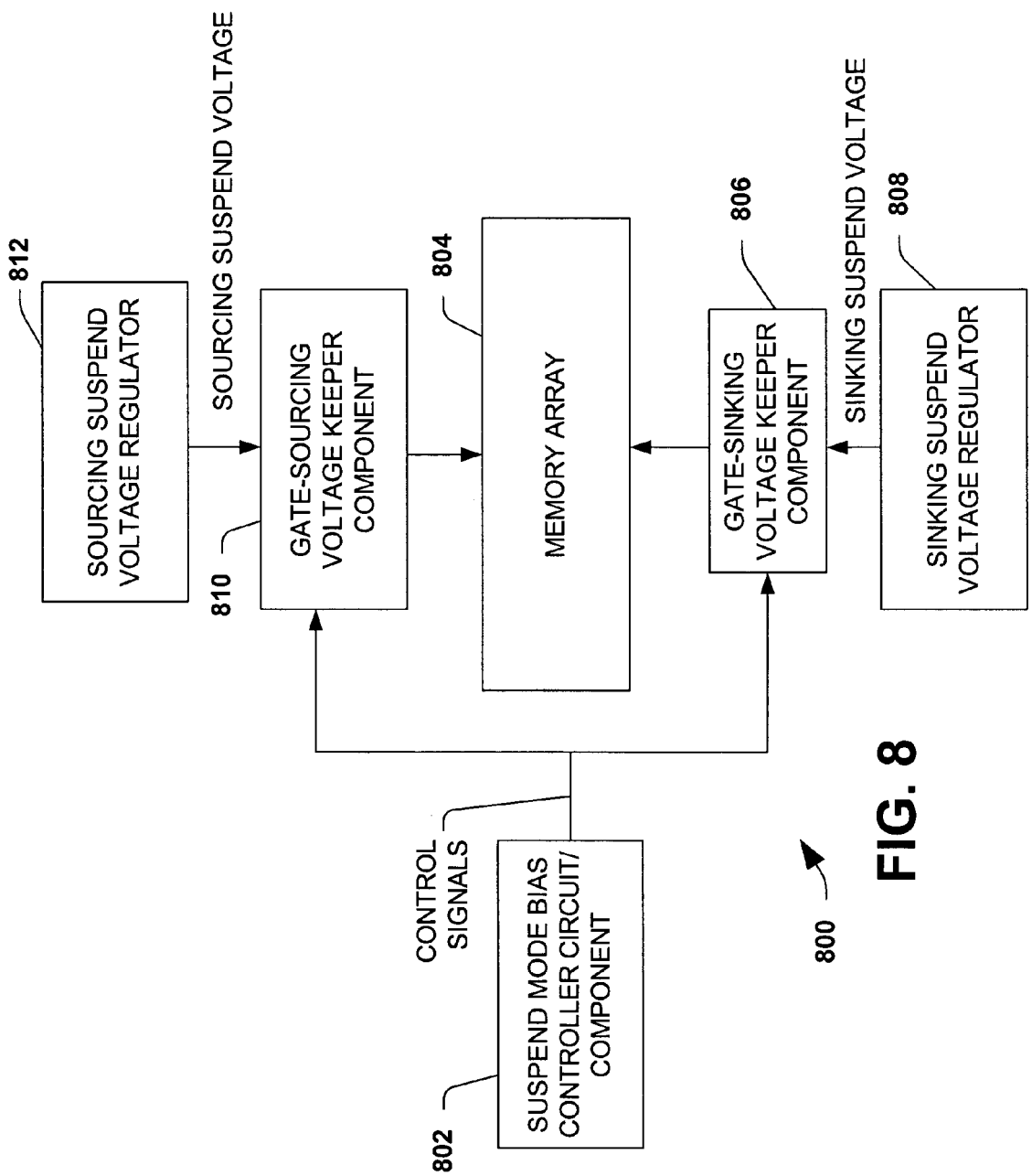
FIG. 8 is a block diagram illustrating a memory device portion that mitigates power consumption during a suspend mode in accordance with an aspect of the present invention.

FIG. 8 is a block diagram illustrating a memory device 800 that mitigates power consumption during a suspend mode of operation in accordance with an aspect of the present invention. The device 800 includes a suspend mode controller 802, a memory array 804, a gate-sinking voltage keeper component 806, a sinking suspend voltage regulator 808, a gate-sourcing voltage keeper component 810, and a sourcing suspend voltage regulator 812. The memory device 800 can be employed in a portable device such as a personal digital assistant, cellular phone, digital audio player, digital media player, and the like. Additionally, the memory device can be an SRAM, or other type memory device.

The controller 802 handles suspend mode operations for the memory device 800. The controller 802 can comprise at least a portion of a power management system internal and/or external to the memory device 800. The controller 802 can be operable to control other modes of operation (e.g., normal mode). The controller 802 generates control signals that are received by the gate-sinking voltage keeper component 806 and the gate-sourcing voltage keeper component 810. Generally, the controller 802 de-asserts the suspend control signal during normal mode and asserts the suspend control signal during the suspend mode of operation.

Upon the control signal being asserted, the gate-sinking voltage keeper component 806 supplies a sinking suspend voltage generated and regulated by the sinking suspend voltage regulator 808 to the memory array 804, while the gate-sourcing voltage keeper component 810 supplies a sourcing suspend voltage generated and regulated by the sourcing suspend voltage regulator 812 to the memory array 804. Upon the control signal being de-asserted, the gate-sinking voltage keeper component 806 isolates the memory array 804 from the sinking suspend voltage regulator 808, while the gate-sourcing voltage keeper component 810 isolates the memory array 804 from the sourcing suspend voltage regulator 812. During the suspend mode of operation, the gate-sinking voltage keeper component 806 sinks at least a portion of leakage current generated/sourced by the memory array 804. As a result, less leakage current needs to be sunk by other devices/paths (e.g., the suspend voltage regulator) thereby consuming less power (standby power) than other memory devices that employ gate-sourcing voltage keeper components that operate as sources during the suspend mode of operation.

A sourcing suspend voltage regulator 812 operates similar to the sinking suspend voltage regulator 808, but generates and supplies a sourcing suspend voltage to the memory array 804. A gate-sourcing voltage keeper component 810 can be employed to controllably provide the sourcing suspend voltage to the memory array 804.

Figure 9:
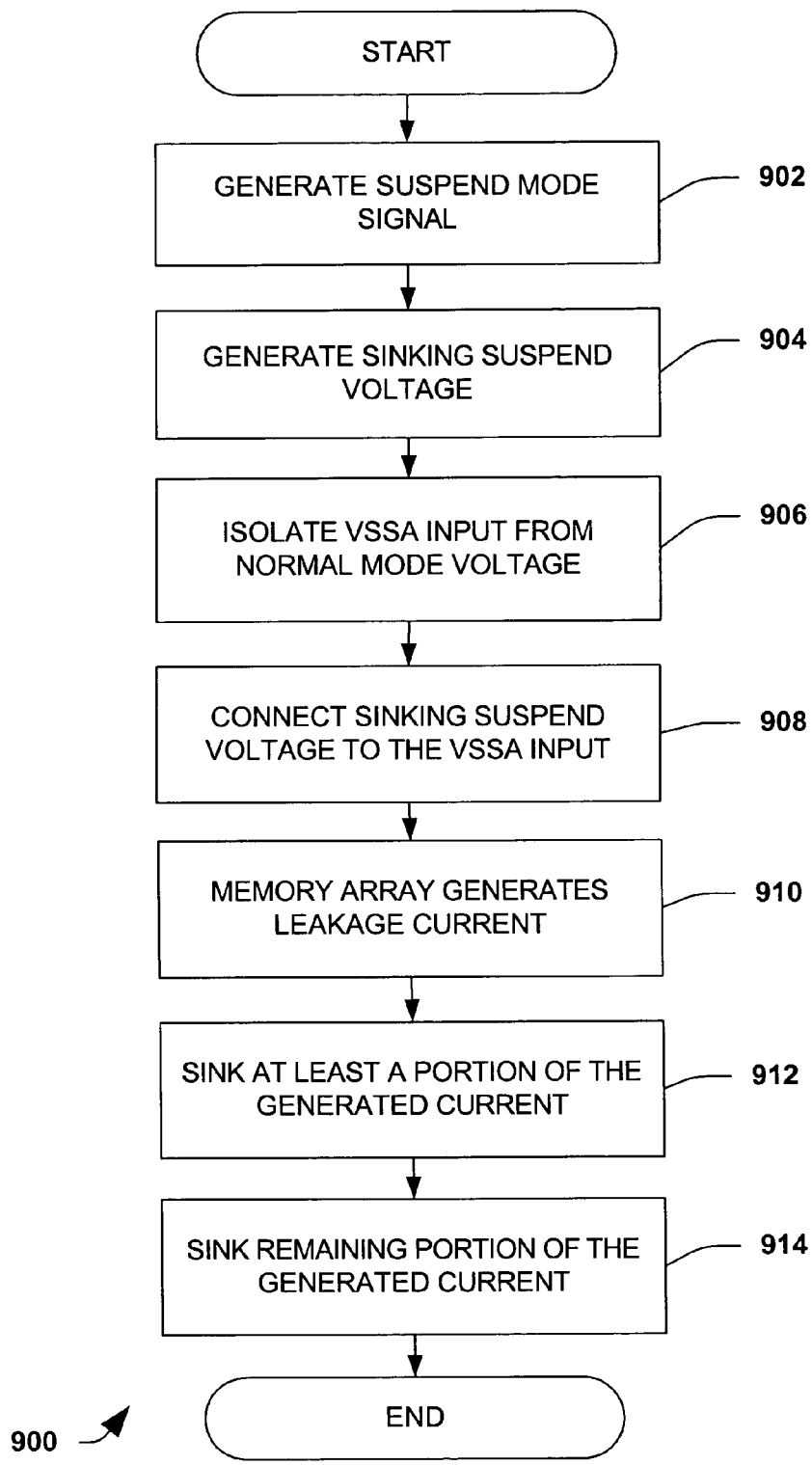
FIG. 9 is a flow diagram illustrating a method of operating a memory device in a suspend mode in accordance with an aspect of the present invention.
Figure 10:
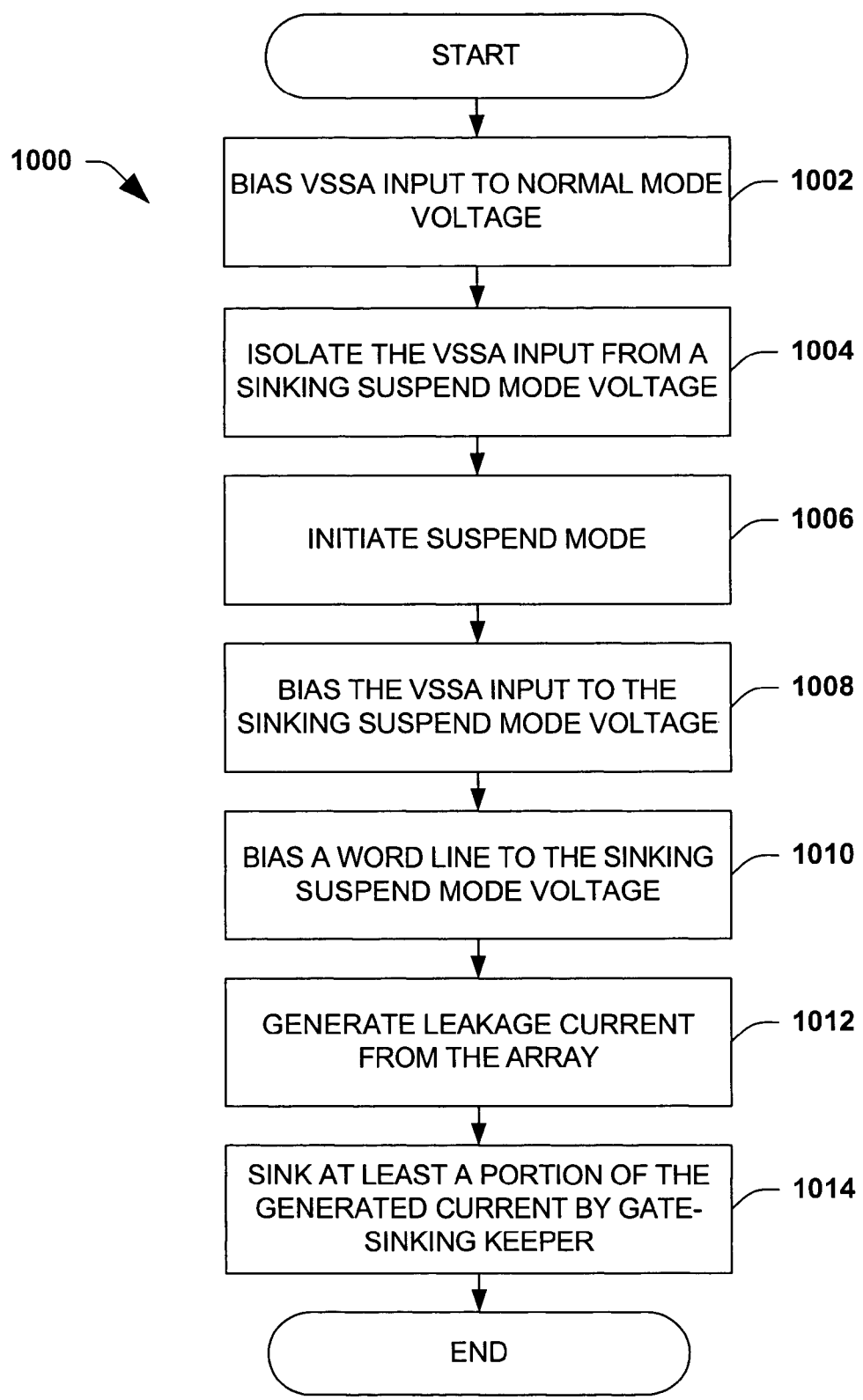
FIG. 10 is a flow diagram illustrating a method of operating a memory device in accordance with an aspect of the present invention.

In view of the foregoing structural and functional features described supra, methodologies in accordance with various aspects of the present invention will be better appreciated with reference to FIGS. 1–8. While, for purposes of simplicity of explanation, the methodologies of FIGS. 9–10 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Turning now to FIG. 9, a flow diagram illustrating a method 900 of operating a memory device in a suspend mode of operation in accordance with an aspect of the present invention is provided. The method 900 mitigates leakage current generated by the device during the suspend mode of operation by employing one or more voltage keeper components to sink at least a portion of leakage current generated by a memory array and/or other components of the memory device.

The method 900 begins at block 902 wherein a controller generates a suspend mode control signal. The control signal is typically de-asserted (e.g., low) during the suspend mode of operation. However, in alternate aspects of the invention, the control signal can be asserted (e.g., high) during the suspend mode of operation. Generally, a control signal is asserted when the signal activates a device, and is de-asserted when the signal operates to de-activate, or turn off, a device. Additionally, it is appreciated that alternate configurations may be employed, and such alternatives are contemplated by the present invention. At block 904, a sinking suspend mode voltage is generated by a voltage regulator. This voltage is generally higher than the standard VSS voltage employed by the device and is selected to provide sufficient voltage across the array to enable resumption of normal mode and maintain data.

Continuing on, a VSSA input of a memory array is disconnected or isolated from a normal mode voltage (VSS) at block 906. Generally, a footer is provided with the control signal and isolates the voltage supply input of the array from the normal mode supply voltage on the control signal being asserted. At block 908, a gate-sinking voltage keeper component connects the sinking suspend voltage to the memory array in response to the control signal. Typically, the sinking suspend voltage is supplied to one or more control and/or power lines including a word line and the VSS supply (VSSA) of the array.

During the suspend mode of operation, the memory array generates/sources leakage current at block 910. The leakage current results from pathways/devices within the array that are directly or indirectly connected to a suspend supply voltage. At block 912, at least a portion of the generated leakage current is sunk or dissipated by the gate-sinking voltage keeper components. A remaining portion of the generated leakage current is sunk at block 914, typically by circuitry within the voltage regulator.

FIG. 10 is a flow diagram illustrating a method 1000 of operating a memory device in accordance with an aspect of the present invention. This method 1000 serves to illustrate transitions to and from suspend mode and associated operations performed in accordance with the present invention. Portions of the method 1000 are specific to the modes of operation, but can be performed in any suitable order.

Beginning at block 1002, VSSA input of a memory array is biased to a normal VSS voltage and a VDDA input is biased to a normal VDD voltage. Continuing at block 1004, the VSSA input and a word line are isolated from a suspend mode voltage by one or more voltage keeper components.

A suspend mode of operation is initiated at block 1006 by a power management system and/or controller. Subsequently, the VSSA input of the memory array is isolated from the normal array mode voltage and is biased to a suspend mode voltage by a first gate-sinking voltage keeper component and the supply voltage input is biased to a sinking suspend voltage at block 1008. The word line of the memory array is also biased to the sinking suspend voltage by a second gate-sinking voltage keeper component at block 1010. The memory array generates an amount of leakage current during the suspend mode of operation at block 1012. The first gate-sinking voltage keeper component and the second gate-sinking voltage keeper component sink at least a portion of the generated leakage current at block 1014. On exiting the suspend mode of operation, the method 1000 returns to block 1002.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A memory device comprising:
   a memory array comprised of an array of memory cells, wherein the memory array generates leakage current during a suspend mode of operation;
   a sinking suspend voltage regulator that generates a sinking suspend voltage;
   a gate-sinking voltage keeper component that controllably connects an array VSS voltage input of the memory array to the sinking suspend voltage regulator during the suspend mode and that operates as a leakage current sink; and
   a controller component connected to the gate-sinking voltage keeper component to controllably bias the gate-sinking voltage keeper component, thereby activating the gate-sinking voltage keeper component which in response couples the sinking suspend voltage to a portion of the memory array upon initiation of the suspend mode.

2. The memory device of claim 1, wherein the gate-sinking voltage keeper component comprises a pmos transistor.

3. The memory device of claim 2, wherein a gate of the pmos transistor is connected to a control signal generated by the controller component.

4. The memory device of claim 3, wherein the control signal is asserted during the suspend mode of operation.

5. The memory device of claim 1, wherein the gate-sinking voltage keeper component electrically connects to an array supply voltage input of the memory array.

6. The memory device of claim 1, wherein the gate-sinking voltage keeper component electrically connects to a word line of the memory array.

7. A memory device comprising:
   a memory array comprised of an array of memory cells, wherein the memory array generates leakage current during a suspend mode of operation;
   a sinking suspend voltage regulator that generates a sinking suspend voltage;
   a gate-sinking voltage keeper component that controllably connects the memory array to the sinking suspend voltage regulator during the suspend mode and that operates as a leakage current sink;
   a controller component connected to the gate-sinking voltage keeper component to controllably bias the gate-sinking voltage keeper component, thereby activating the gate-sinking voltage keeper component which in response couples the sinking suspend voltage to a portion of the memory array upon initiation of the suspend mode; and
   one or more additional gate-sinking voltage keeper components that controllably connect bit lines of the memory array to the suspend voltage regulator.

8. The memory device of claim 1, wherein the sinking suspend voltage is about 0.3 to 0.8 volts.

9. A memory device comprising:
   a memory array comprised of an array of memory cells, wherein the memory array generates leakage current during a suspend mode of operation;
   a sinking suspend voltage regulator that generates a sinking suspend voltage;
   a gate-sinking voltage keeper component that controllably connects the memory array to the sinking suspend voltage regulator during the suspend mode and that operates as a leakage current sink;
   a controller component connected to the gate-sinking voltage keeper component to controllably bias the gate-sinking voltage keeper component, thereby activating the gate-sinking voltage keeper component which in response couples the sinking suspend voltage to a portion of the memory array upon initiation of the suspend mode; and
   wherein a VDDA input of the memory array is biased to a normal mode voltage during a normal mode and to a sourcing suspend voltage during the suspend mode of operation.

10. The memory device of claim 9, wherein the normal mode voltage is about 1.3 to 1.0 volts and the sourcing suspend voltage is about 0.7 to 0.4 volts below the normal mode voltage.

11. The memory device of claim 1, further comprising a footer switch that controllably connects a VSS voltage to a VSSA input of the memory array.

12. The memory device of claim 1, further comprising row periphery circuitry that addresses one or more of the memory cells during normal mode.

13. The memory device of claim 1, wherein the sinking suspend voltage regulator is further operable as a leakage current sink to dissipate leakage current not sunk by the gate-sinking voltage keeper component.

14. A memory device comprising:
a memory array comprised of an array of memory cells, wherein the memory array generates leakage current during a suspend mode of operation;
a sinking suspend voltage regulator that generates a sinking suspend voltage;
a gate-sinking voltage keeper component that controllably connects the memory array to the sinking suspend voltage regulator during the suspend mode and that operates as a leakage current sink;
a controller component connected to the gate-sinking voltage keeper component to controllably bias the gate-sinking voltage keeper component, thereby activating the gate-sinking voltage keeper component which in response couples the sinking suspend voltage to a portion of the memory array upon initiation of the suspend mode;
wherein the sinking suspend voltage regulator is further operable as a leakage current sink to dissipate leakage current not sunk by the gate-sinking voltage keeper component; and
wherein the sinking suspend voltage regulator is a low-dropout voltage regulator.

15. A memory device comprising:
a memory array comprised of an array of memory cells, wherein the memory array generates leakage current during a suspend mode of operation;
a sinking suspend voltage regulator that generates a sinking suspend voltage;
a gate-sinking voltage keeper component that controllably connects the memory array to the sinking suspend voltage regulator during the suspend mode and that operates as a leakage current sink;
a controller component connected to the gate-sinking voltage keeper component to controllably bias the gate-sinking voltage keeper component, thereby activating the gate-sinking voltage keeper component which in response couples the sinking suspend voltage to a portion of the memory array upon initiation of the suspend mode; and
a gate-sourcing voltage keeper and a sourcing suspend voltage regulator that generates a sourcing suspend voltage, wherein the gate-sourcing voltage keeper connects the sourcing voltage to a VDDA input of the memory array during the suspend mode.

16. A method of operating a memory device in a suspend mode of operation comprising:
biasing one or more inputs of a memory array to a sinking suspend voltage by one or more gate-sinking voltage keeper components, wherein the one or more inputs include a VSSA input;
generating leakage current by the memory array; and
sinking at least a portion of generated leakage current from the memory array by the one or more gate-sinking voltage keeper components.

17. The method of claim 16, wherein biasing one or more inputs comprises selectively coupling the sinking suspend voltage to the one or more inputs of the memory array by the one or more gate-sinking voltage keeper components.

18. The method of claim 16, further comprising:
connecting the VSSA input of the memory array to a normal mode voltage during a normal mode of operation and isolating the VSSA input from the sinking suspend voltage via one of the gate-sinking voltage keeper components during the normal mode of operation.

19. The method of claim 16, further comprising generating a suspend mode of operation control signal that selectively controls the one or more gate-sinking voltage keeper components.

20. A memory device comprising:
a memory array comprised of an array of memory cells, wherein the memory array generates leakage current during a suspend mode of operation;
a sinking suspend voltage regulator that generates a sinking suspend voltage;
a gate-sinking voltage keeper component that controllably connects the memory array to the sinking suspend voltage regulator during the suspend mode and that operates as a leakage current sink;
a controller component connected to the gate-sinking voltage keeper component to controllably bias the gate-sinking voltage keeper component, thereby activating the gate-sinking voltage keeper component which in response couples the sinking suspend voltage to a portion of the memory array upon initiation of the suspend mode; and
generating the sinking suspend voltage by a low-dropout voltage regulator.

21. The method of claim 16, further comprising sinking a remaining portion of the generated leakage current.

22. The method of claim 16, further comprising isolating a VSSA input from a normal mode array voltage supply.

23. A method of operating a memory device comprising:
biasing a VSSA input of a memory array to a normal array mode voltage during normal mode;
isolating the VSSA input and a word line from a sinking suspend voltage by one or more gate-sinking voltage keeper components during the normal mode;
initiating a suspend mode of operation;
isolating the VSSA input of the memory array from the normal array mode voltage during the suspend mode of operation;
biasing the VSSA input to the sinking suspend voltage during the suspend mode of operation;
biasing the word line to the sinking suspend voltage during the suspend mode of operation.
generating leakage current by the memory array during the suspend mode of operation; and
sinking at least a portion of the generated leakage current by one or more gate-sinking voltage keeper components.

24. The method of claim 23, further comprising:
biasing a VDDA input to a normal mode supply voltage during the normal mode; and
biasing the VDDA input to a sourcing suspend voltage via a gate-sourcing voltage keeper during the suspend mode of operation.

25. The method of claim 23, wherein the VSSA input is biased to the sinking suspend voltage by one of the gate-sinking voltage keeper components.

* * * * *